US010228428B2

(12) United States Patent
Gustafsson et al.

(10) Patent No.: US 10,228,428 B2
(45) Date of Patent: Mar. 12, 2019

(54) METHOD AND DEVICE FOR POSE TRACKING USING VECTOR MAGNETOMETERS

(75) Inventors: Fredrik B R Gustafsson, Linkoping (SE); Niklas T. Wahlström, Linkoping (SE)

(73) Assignee: STYLAERO AB, Linköping (SE)

( * ) Notice: Subject to any disclaimer, the term of this patent is extended or adjusted under 35 U.S.C. 154(b) by 1329 days.

(21) Appl. No.: 13/427,118

(22) Filed: Mar. 22, 2012

(65) Prior Publication Data

US 2013/0249784 A1    Sep. 26, 2013

(51) Int. Cl.
| | |
|---|---|
| G01R 33/07 | (2006.01) |
| G06F 3/0346 | (2013.01) |
| G06F 3/038 | (2013.01) |
| G01C 17/28 | (2006.01) |

(52) U.S. Cl.
CPC .......... G01R 33/072 (2013.01); G01C 17/28 (2013.01); G06F 3/038 (2013.01); G06F 3/0346 (2013.01)

(58) Field of Classification Search
CPC ......... G06F 3/0346; G06F 3/017; G06F 3/046
USPC ............. 324/207.17, 247, 244; 345/156, 158
See application file for complete search history.

(56) References Cited

U.S. PATENT DOCUMENTS

| | | | |
|---|---|---|---|
| 4,622,644 A | 11/1986 | Hansen | |
| 5,687,080 A * | 11/1997 | Hoyt | G05G 9/047 345/161 |
| 5,762,064 A | 6/1998 | Polvani | |
| 6,129,668 A | 10/2000 | Haynor et al. | |
| 6,263,230 B1 | 7/2001 | Haynor et al. | |
| 8,223,121 B2 * | 7/2012 | Shaw et al. | 345/158 |
| 8,321,173 B2 * | 11/2012 | Wallance et al. | 702/150 |
| 8,515,707 B2 * | 8/2013 | Joseph et al. | 702/141 |
| 2003/0095115 A1 | 5/2003 | Brian et al. | |
| 2004/0012574 A1 * | 1/2004 | Sharma | G06F 3/014 345/179 |
| 2006/0061354 A1 | 3/2006 | Wallance et al. | |
| 2010/0095773 A1 * | 4/2010 | Shaw et al. | 73/514.31 |
| 2010/0097316 A1 * | 4/2010 | Shaw et al. | 345/158 |

(Continued)

FOREIGN PATENT DOCUMENTS

WO    2011146668 A2    11/2011

OTHER PUBLICATIONS

Aziz, et al; *A Real-Time Tracking System for an Endoscopic Capsule Using Multiple Magnetic Sensors*; article; pp. 201-218; 2008.

(Continued)

*Primary Examiner* — Peter D McLoone
(74) *Attorney, Agent, or Firm* — Miller, Matthias & Hull LLP (57) ABSTRACT

In accordance with various embodiments of the invention, a user-borne computer input device is disclosed including a 5D or greater "mouse" or other tool or object containing or consisting of one or more permanent magnetic presenting permanent magnetic dipoles. The position and orientation of the device are determined by magnetic field strength measurements derived from at least two vector-magnetometers fixed in a reference frame connected to the computing device. The system allows a user to interact with the computing device in at least 5 dimensions by manipulating the position and orientation of the device within a measurement volume, which may be a few cubic meters.

20 Claims, 4 Drawing Sheets

(56) References Cited

U.S. PATENT DOCUMENTS

| | | | |
|---|---|---|---|
| 2010/0174506 A1 | 7/2010 | Joseph et al. | |
| 2011/0190060 A1 | 8/2011 | Ketabdar et al. | |
| 2011/0238399 A1 | 9/2011 | Ophir et al. | |
| 2012/0065917 A1* | 3/2012 | Takahashi | G06F 3/0346 702/104 |
| 2012/0256821 A1* | 10/2012 | Olsson et al. | 345/156 |

OTHER PUBLICATIONS

William A. Beck; *Localization of Small Magnets Against a Noisy Background*; magazine; pp. 6-12; 2000; vol. 4241.

Fang, et al.; *Optimization of Measuring Magnetic Fields for Position and Orientation Tracking*; 2011; pp. 440-448; magazine; vol. 16 No. 3.

Guignet, et al.; *Magnet Tracking: a new tool for in vivo studies of the rat gastrointestinal motility*; 2006; pp. 472-478; journal.

Hu, et al.; *3-Axis Magnetic Sensor Array System for Tracking Magnet's Position and Orientation*; 2006; article; pp. 5304-5308.

Hu, et al.; *A linear Algorithm for Tracing Magnet Position and Orientation by Using Three-Axis Magnetic Sensors*; 2007; article; pp. 4096-4101.

Hu, et al.; *A Cubic 3-Axis Magnetic Sensor Array for Wirelessly Tracking Magnet Position and Orientation*; journal; pp. 903-913; 2010; vol. 10 No. 5.

Hu, et al.; *Efficient Magnetic Localization and Orientation Technique for Capsule Endoscopy*; journal; pp. 23-37; vol. 2, No. 1; 2005.

Mehmood, et al.; *A Real-time Tracking System for In Vivo Endofunctional Capsule Using Magnetic Sensors*; journal; pp. 598-601; 2012.

Schlageter, et al.; *Tracking system with five degrees of freedom using a 3D-array of Hall sensors and a permanent magnet*; pp. 37-42; 2000.

Sherman, et al.; *Characterization of a Novel Magnetic Tracking System*; pp. 2725-2727; journal; 2007; vol. 43, No. 6.

Stathopoulos, et al.; *Magnetic ill tracking: a novel non-invasive tool for investigation of human digestive motility*; 2005; pp. 148-154; article.

Wang, et al.; *A Localization Method Using 3-axis Magetoresistive Sensors for Tracking of Capsule Endoscope*; pp. 2522-2525; article; 2006.

Yabukami, et al.; *A New Tracking System of Jaw Movement Using Two Magnets*; pp. 33153317; journal; vol. 38, No. 5; 2002.

Yabukami, et al.; *Magnetic Wireless Motion Capturing System and its Application for Jaw Tracking System and 3D Computer Input Device*; 2003; pp. 70-73; journal; vol. 8, No. 1.

Placidi, et al.; *Review on Patents about Magnetic Localisation Systems for in vivo Cathererizations*; journal; pp. 58-64; vol. 2, No. 1; 2009.

International Search Report and Written Opinion for Corresponding International Application No. PCT/IB2013/001229 filed Mar. 22, 2013. Report dated Oct. 15, 2013.

* cited by examiner

METHOD AND DEVICE FOR POSE TRACKING USING VECTOR MAGNETOMETERS

TECHNICAL FIELD OF THE DISCLOSURE

The present disclosure relates to position and orientation tracking and, more particularly, relates to tracking in a small volume, e.g., one or a few cubic meters, for providing pose information relating to a tool for interacting with a computer program.

BACKGROUND OF THE DISCLOSURE

In the technical area of object position tracking, a tracker or tracking system is a device or structure that determines a position of an object, e.g., in two or three dimensions. A tracking system may also determine an object's orientation, i.e., a direction in which the object is pointing relative to some defined frame of reference. The combination of an object's position and the object's orientation may be referred to as the object's "pose." Thus, one could say that a pose tracker determines both the position and orientation of an object in three dimensions.

In a similar vein, target tracking relates to determining the position of one or more objects that may be referred to as "targets." Target tracking is used in a number of applications, from tracking known particles in our solar system, to tracking commercial ships and aircraft at each continent, to tracking players in football and other games. Tracking systems for indoor use may be employed to locate entire objects, e.g., unmanned vehicles or manufacturing and surgical tools, or may be used to track portions of larger objects, e.g., for human motion analysis, etc.

In some cases, object motion is tracked in order to provide input to another system. An example of this is the set of devices currently usable to provide user input to a computing device. For controlling computer programs (games, word processors, CAD programs, geographical information systems, utility programs, etc.), the primary motion-based options today include computer "mice," touch screens or touch pads, and joysticks.

Computer mice input devices are generally mechanical, opto-mechanical or laser-based optical devices. Such devices typically measure two-dimensional translation of the device on a flat surface. Touch screens and touch pads employ any of a number of technologies to again track a user digit in two dimensions. Exemplary technologies used in such devices include touch resistive technology, multi-touch capacitive technology, multi-touch optical (based on diffraction) and touch wave (acoustic surface) technologies. These techniques all rely on a screen that is covered with a specialized material that enables either single or multi-touch taps and/or drag movements relative to a position on the screen.

The third mentioned technology, joysticks, have been in fairly long and widespread use for interactions with computing devices such as game systems or personal computers. In one example, the velocity of a cursor is controlled with a variable rate by tracking movement of the stick in two dimensions.

In the examples above, the input device is relatively inexpensive, but the control enabled by the device is inherently limited to two dimensions. For tracking in three dimensions, there exist certain free-hand tracking systems based on gyros and accelerometers. For example, an accelerometer can be used to determine acceleration in the vertical direction, and an additional vector magnetometer can be used to determine the magnetic north direction, if there are no magnetic disturbances in the surroundings, to yield orientation information. In theory the acceleration data from the accelerometers can be integrated twice using the orientation information, to determine the relative position of the device.

However, this technique will allow a gradual drift in calculated position relative to the device's actual position, making this combination unsuitable for determining pose. Additional global navigation satellite systems (GNSS) sensors can be used outdoors and ultra-wideband (UWB) systems can be used indoors to stabilize the position to supplement the system described above over large operating volumes.

In another technique, one or more cameras may be used to track a special marker. This system is often used as a benchmark solution due to its high precision. BBC has developed a similar system called free-D for augmented reality, wherein the ceiling is equipped with a number of markers, and an auxiliary camera is mounted on top of a film camera to detect the visual markers. With this system too, accurate pose can be computed. However, such systems, when developed to the point that they provide accurate information, i.e., high precision of pose, are expensive and require fixed installations. Moreover, the update rate is limited by the frame rate of cameras. The latter limitation can be mitigated by using gyros and accelerometers on the tool, however, this will of course increase the already substantial price of the system yet further.

Other systems that attempt to determine pose use an accelerometer and/or gyro together with an IR camera, A row of IR diodes is placed at the screen, and the tool computes its orientation relative to the diodes, given they are in the field of view of the camera. A similar system uses a laser projector placed at the screen that projects a special pattern. An IR camera detects the returned laser reflections, and provides a range image of a part of the surroundings. The 3D image is combined with a standard color camera, and the system can track a number of players and their gestures and movements in three dimensions. However, the orientation of a device cannot be determined with this principle.

One class of systems employs magnetometers. Some such systems measure the magnitude of the magnetic field to calculate a distance to a device, but typically cannot discern the device orientation. Other types of systems require specialized sensor locations or setup. Other systems use a magnetometer in a hand-held tool, which detects its own movement relative to a static magnetic field and wirelessly transmits this data back to the computer. However, this system requires a much more expensive tool. In general, the systems that exist to attempt to track a device either do not perform accurately or do provide high accuracy, but only at a correspondingly high cost in dollars or user effort.

It will be appreciated that this background section was created by the inventors for the reader's convenience, and is meant to discuss problems and solutions noted by the inventors, not to discuss or explain prior art. Thus the inclusion of any problem or a solution in this section is not an indication that the problem or a solution is prior art.

SUMMARY OF THE DISCLOSURE

As noted above, existing examples of tracking systems are either limited to a few dimensions, or require an expensive tool and a pre-deployed infrastructure. None of the inventions based on magnetometers enable tracking of both position and orientation of a free-hand tool.

In accordance with one aspect of the invention, two or more vector magnetometers are mounted in a fixed relationship to one another. In one embodiment, the vector magnetometers are mounted behind or at the border of a computer screen, and in another embodiment the vector magnetometers are mounted on a separate flat rectangle, similar to a mouse pad. The device itself incorporates one or more permanent magnets. The tracked device, referred to herein as a user device, mouse, tool, etc., will be encompassed by the term "user-borne device," and includes devices held by a user, worn by a user (e.g., on the wrist, hand, leg, foot, head, etc.), or attached to an object such as a club, bat, or racket carried by the user. Moreover, the user-borne device, at its minimum, need only include a permanent magnet.

In this way, as will be described in greater detail below, a pair of two three-axis magnetometers can provide six measurements of the six degrees of freedom of pose. By then inverting a system of equations, the pose can be determined With the described system, there is no external infrastructure needed beyond what the operator is used to. Moreover, the system can be made very small and inexpensively, in particular when using MEMS technology, and may be built into computer screens and smart-phones. Aiding this embodiment, many smart-phones today contain one vector magnetometer already (for the compass function).

Further, the device manipulated by the user need not communicate with the tracking system, and is thus inexpensive, simple, and does not require battery charging or replacement. The lack of required hardware also enables the device to be produced in very small forms, enabling it to be embedded in tools with which the operator is already accustomed, i.e., a pen, a knife, a gun or a body part (pointing finger).

In addition to the simplicity and small form factor offered by the device, the system can also be made very fast compared to state of the art tracking systems, since the magnetometers can sample with 1 kHz or more. Moreover, unlike the situation when a magnetometer is used as a compass, the disclosed method is insensitive to magnetic disturbances, since the magnetic environment is calibrated either off-line when the system is turned on, or on-line adaptively during use.

With a small permanent magnet that can be fitted into a normal pen, the coverage of the system is about one cubic meter (volumes of about one cubic meter and smaller are referred to herein as small volumes). The larger magnet on the device, the larger the potential coverage area, and indeed the covered volume increases linearly with the size of the magnet. Moreover, while use of a single dipole does not allow rotation of the device about its main axis to be resolved, the use of two spatially separated dipole magnets, not aligned to each other, allows all three angles to be determined. In addition, more than two magnetometers may also be used if desired to mitigate possible near-field effects when the tool is close to one sensor.

While the present disclosure allows and encourages various modifications and alternative constructions, certain illustrative embodiments will be shown and described below in detail. It should be understood that there is no intention to limit the invention to the specific embodiments disclosed, but on the contrary, the intention is to cover all modifications, alternative constructions, and equivalents within the spirit and scope of the present disclosure.

DETAILED DESCRIPTION OF THE DISCLOSURE

The present disclosure provides a system and method for providing and tracking a 5D or greater "mouse" containing one or more permanent magnetic presenting permanent magnetic dipoles. The position and orientation of the mouse are determined by magnetic field strength measurements derived from at least two vector-magnetometers fixed in a reference frame including the computing device. The system allows a user to interact with the computing device in at least 5 dimensions by manipulating the position and orientation of the hand-held user device within a measurement volume.

Figure 1:
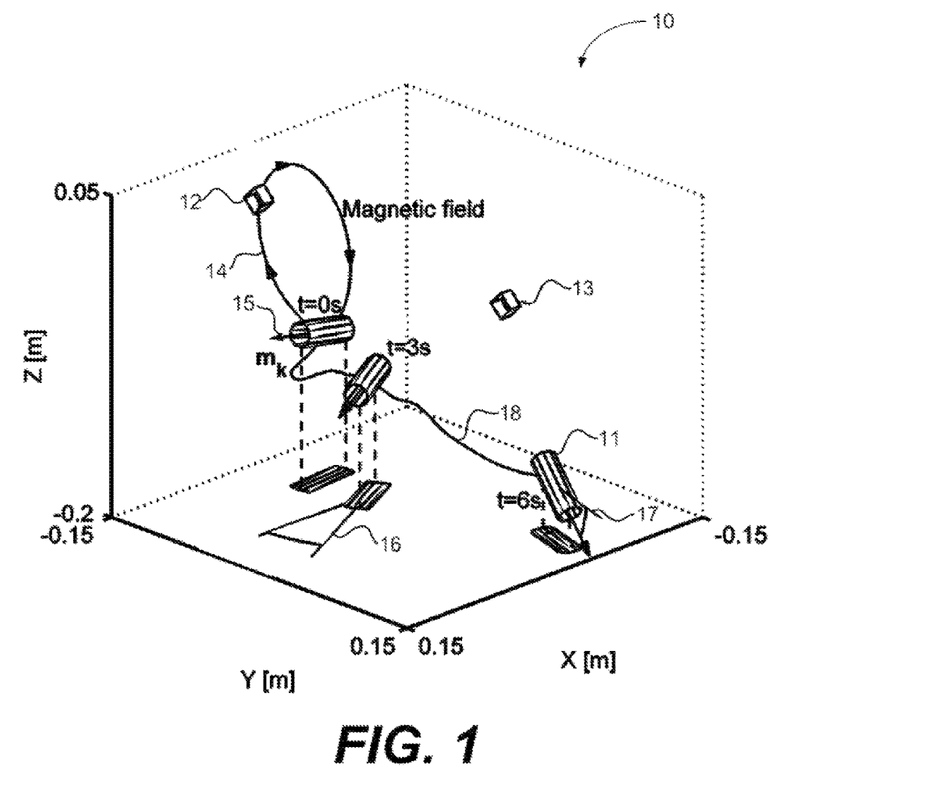
FIG. 1 is a schematic diagram illustrating a tracking system in accordance with an embodiment of the invention, including the estimated trajectory of a ferromagnetic object during a test run.

Referring now to FIG. 1, this figure illustrates an example tracking system environment in accordance with an embodiment of the invention. The tracking system 10 consists of at least one ferromagnetic object 11 and two or more vector-magnetometers 12, 13 (two are shown in the example of FIG. 1). The ferromagnetic object 11 includes at least one permanent ferromagnet, i.e., a magnet made of ferrous material which induces a magnetic field 14 without any driving force. As a permanent magnet, the ferromagnetic object 11 does not require any external power or electronics to produce the magnetic field 14. Also, as a consequence of the permanent magnetic nature of the ferromagnetic object 11, the induced magnetic field 14 has only a DC, or static, component and does not have a defined frequency (other than 0 Hz).

The magnetic field 14 is preferably of sufficient magnitude to be sensed by the two or more vector-magnetometers 12, 13. As will be described in greater detail below, the measured magnetic field is associated with the position of the ferromagnetic object 11 relative to the two or more vector-magnetometers 12, 13. Moreover, since the induced magnetic field 14 has a magnetic dipole moment vector 15 parallel with the ferromagnetic object 11, the measured magnetic field is also indicative of the yaw 16 and pitch 17 angles of the ferromagnetic object 11.

In a further embodiment of the tracking system 10, the at least one ferromagnetic object 11 includes a plurality of ferromagnets having different relative orientations. By aligning the plurality of ferromagnets in mutually distinct directions, all three degrees of freedom for the orientation (yaw, pitch and roll) of the ferromagnetic object 11 can be measured via the two or more vector-magnetometers 12, 13. In other words, while rotation of the device about a dipole axis cannot be differentiated when the device has only a single dipole, the use of two or more spatially separated dipole magnets not aligned to each other allows all three angles to be determined.

In order to yield a pose estimate from the collected vector-magnetometer data, data processing is executed in an embodiment of the invention via a statistical signal processing framework. In this embodiment, the framework is based on a mathematical system description relating the position and orientation of the ferromagnetic object 11 to the vector magnetometer measurements. Although this framework will be described in detail hereinafter, it will be appreciated by those of skill in the art that other frameworks may be used instead or in addition.

Regarding pose estimation, in the statistical signal processing framework, measurements can be described with a measurement equation as follows, $$y_n = h(x_n) + e_n \qquad (1)$$

where $y_n$ is the measurement, $x_n$ is the state of the system and $e_n$ is the measurement noise, all at time instant $nT_s$, $T_s$ being the sample period. Although not critical, the measurement noise is here assumed to be white Gaussian $w_n \sim N(0, Q)$. The sensor model in Equation (1) above is described in greater detail below.

The measurement from a stationary vector-magnetometer can be decomposed into a constant bias term, herein denoted b, and a time varying term. The constant bias term may be composed of the earth magnetic field, for example, and any magnetic distortions due the stationary magnetic environment, e.g., large iron fixtures, static electromagnetic fields, etc.

The time varying term, however, corresponds to magnetic distortions caused by motion of ferromagnetic object 11. We can model the ferromagnetic object 11 as a magnetic dipole, which gives rise to a magnetic dipole field as given by Maxwell's equations. This field decays cubically with the distance to the dipole. With J magnetometers positioned at $\{\theta_j\}_{j=1}^{J}$ relative to the first sensor $\theta_1 = 0$ this then yields $$h_j(x_n) = b + \frac{1}{\|r_{n,j}\|^5}(3 r_{n,j} r_{n,j}^T - \|r_{n,j}\|^2 I_3) m_n, \qquad (2)$$

where $m_n$ is the magnetic dipole moment of the ferromagnetic object 11, the function $r_n = [r_n^{(x)}, r_n^{(y)}, r_n^{(z)}]$ its position, and $r_{n,j} = r_n - \theta_j$ its position relative to the sensor j. In Equation 2, the quantity $x_n$ is the state of the tracking system as given below via expression (7).

In another embodiment, the Anderson function expansion can be used instead of the expression of Equation (2) to model the magnetometer signal. However, it will be appreciated that the Anderson function expansion relies on a linear motion of the tool. As such, the tool trajectory would be split into smaller sections, which are then approximated as linear motion.

The magnetic dipole moment $m_n$ is parallel with the ferromagnet. Thus, its direction will reveal the orientation of the magnet. This can be described by introducing a rotation matrix $R(\psi_n, \theta_n)$ and defining $m_n$ as follows:

$$m_n = R(\psi_n, \theta_n) m, \text{ where } m = m \cdot [1,0,0]^T \qquad (3)$$

Here, m denotes the strength of the ferromagnet. It will be appreciated that his constant is tool specific. Since the magnetic dipole moment is invariant to rotation around its axis, the rotation matrix need only include two degrees of freedom for the rotation, here denoted as yaw $\psi_n$ and pitch $\psi_n$. These angles are shown in FIG. 1 by references 16 and 17 respectively.

Given the above, a total measurement model for the J magnetometers can be summarized in one equation as $$y_n = h(x_n) + e_n, \qquad (4)$$

where $$y_n = [y_{n,1}; \ldots ; y_{n,J}] \qquad (5)$$

$$h(x_n) = [h_1(x_n); \ldots ; h_J(x_n)] \qquad (6)$$

$$x_n = [r_n; \psi_n; \theta_n] \qquad (7)$$

and where $y_{n,j}$ is the measurement of the jth sensor, $x_n$ is the state of the system, and $e_n$ is the measurement noise, all at time instant $kT_s$, $T_s$ being the sample period.

In the event of multiple magnetic dipoles in the tool (the ferromagnetic object 11), the sensor model (2) is extended by adding all dipole fields from all magnets to the sensor model as follows:

$$h_j(x_n) = B + \sum_{l=1}^{L} \frac{1}{\|r_{n,j,l}\|^5}(3 r_{n,j,l} r_{n,j,l}^T - \|r_{n,j,l}\|^2 I_3) m_{n,l}. \qquad (8)$$

Here, $r_{n,j,l} = r_n - R(\psi_n, \theta_n, \varphi_n) s_l - \theta_j$, where the indexed quantity $s_l$ denotes vectors from, for example, the first dipole $s_1 = 0$ to dipole number l, and $R(\psi_n, \theta_n, \varphi_n)$ a rotation matrix including all three degrees of freedom for the orientation. As will be appreciated, the vectors are tool specific.

Furthermore, it will be appreciated that all dipole moments $m_{n,l}$ are constrained to rotate in accordance with the tool since the permanent magnets producing the dipole moments are fixed to the tool. This is reflected in a rotation matrix $R(\psi_n, \theta_n, \varphi_n)$ and relating $$m_{n,l} = R(\psi_n, \theta_n, \varphi_n) m_l \qquad (9)$$

where $m_l$ denotes orientation of the dipoles' moments relative to the first dipole $m_1 = m \cdot [1, 0, 0]^T$. These vectors are also known in a given implementation and are tool specific as well.

If any of the relative positions $s_l$ or the dipole moments $m_l$ are aligned differently, the rotation matrix is encoded with all three degrees of freedom for the orientation in order to describe the measurement correctly. Therefore, the state vector is augmented with its roll angle $\varphi_n$, $x_n = [r_n, \psi_n, \theta_n, \varphi_n]$ making it possible to track all three degrees of freedom for the orientation.

In an environment having multiple tools, the sensor model (2) is extended by adding all dipole fields from all tools to the sensor model. By assuming that all tools are described with a single dipole, the following expression results:

$$h_j(x_n) = B + \sum_{i=1}^{I} \frac{1}{\|r_{n,j,i}\|^5}(3 r_{n,j,i} r_{n,j,i}^T - \|r_{n,j,i}\|^2 I_3) m_{n,i}. \qquad (10)$$

As used in Equation 10, $r_{n,j,i} = r_{n,i} - \theta_j$, where $r_{n,i}$ denotes the position of the ith tool.

In contrast to the multi dipole model, the orientations of the dipole moments $m_{n,i}$ are not related. Instead, each of them will describe the orientation for each of the tools as:

$$m_{n,i} = R(\psi_{n,i}, \theta_{n,i}) m_i, \text{ where } m_i = m_i \cdot [1, 0,]^T \quad (11)$$

where the yaw $\psi_{n,i}$ and the pitch $\theta_{n,i}$ describes the orientation of the ith tool. Moreover, in a multi-tool environment, the state vector is augmented with the position and orientation for all tools $x_n = [r_{n,1}, \psi_{n,1}, \theta_{n,1}, \ldots, r_{n,I}, \psi_{n,I}, \theta_{n,I}]$ making it possible to track all tools simultaneously. The last two extensions may be combined to yield a multi tool multi dipole model.

The state of the system $x_n$ can be determined by the nonlinear least squares method as the minimizing argument of the sum of squared model errors, $$\hat{x}_n = \arg\min_x V(x), \quad (12)$$

$$V(x) = (y_n - h(x))^T R^{-1} (y_n - h(x)). \quad (13)$$

The solution is computed by numerical methods. Similar methods such as the maximum likelihood method may also be utilized. With a fixed configuration of magnetic dipoles in the tool, the observation model is extended. Nonetheless, the obtained model can be solved in the least squares sense or similar criterion to obtain an estimate of the pose.

For a set of multi-dipole tools i=1, 2, ..., I, each one characterized with a set of dipole vectors $m_{l,i}$ and relative positions $s_{l,i}$ for l=1, 2, ..., $L_i$, the NLS algorithm can be applied to each possible tool, and the tool with the best fit of model to measurements can be selected automatically via the expressions $$V_i(x) = \|y_n - h_i(x)\|^2, \quad (14)$$

$$\hat{I} = \arg\min_i V_i(x). \quad (15)$$

The described system can also be used in an embodiment to accommodate an environment including a variable geometry tool. A multi-dipole tool is characterized by the dipoles $m_{l,i}$, and their translations $s_l$. Assuming one of them, for instance l=0, to be a reference, the geometry of the remaining dipoles may be variable. That is, the tool can have moveable parts that affect the orientation of translation of the dipoles. In this way, the user can interact with the computer platform without moving the tool itself. This can be used, for example, as a means for selection or "clicking" as in a traditional mouse.

In another embodiment, the state $x_n$ can be estimated from $y_n$ at each sample using the inverse mapping. In this way, the state estimation and the filtering can be separated into two steps. This entails that $x_n$ is identifiable from the measurement $y_n$, which is the case if each measurement $y_n$ consists of at least two full 3D vector magnetometers. The approach with inverse mapping is to invert the augmented sensor model (5) to yield an expression $$y_n = h(x_n) + e_n \leftrightarrow x_n = h^{-1}(y_n - e_n) \triangleq g(y_n - e_n) \quad (16)$$

The mean $E(x_n) = E(g(y_n))$ and covariance $Cov(g(y_n))$ of the inverse mapping will generate a state estimate with corresponding covariance matrix, and these quantities can be computed with numerical methods.

Due to magnetic and electronic noise, as well as slight environmental variations, pose estimation can yield a non-smooth pose estimate over time, even when the tool may not actually be moving. To alleviate this concern, filtering is used in an embodiment of the invention to limit the effect of rapidly fluctuating spurious influences on the system. In particular, in an embodiment of the invention, filtering is employed to smooth a trajectory based on physical motion constraints, e.g., with certain abrupt movements being deemed physically unlikely. The result is a smooth trajectory, at the possible expense of being able to track very rapid motions.

In an embodiment, if a pose estimate is computed at each sample, a smooth pose trajectory can be obtained by way of a low pass filter, i.e., a filter which simply eliminates or attenuates frequency above a certain cut-off, which may be a hard or gradual cut off. In a further embodiment, a model based approach incorporates a model of how the tool is moved dynamically. In the statistical signal processing framework, the measurement equation (4) can be combined with a motion model giving a dynamic state space model $$x_{n+1} = f(x_n) + w_n \quad (17)$$

$$y_n = h(x_n) + e_n \quad (18)$$

where $w_n$ is the process noise. The sensor model (18) was described in (4) and the motion model (17) is described below.

The motion model (17) describes the dynamics of the object. In one embodiment, a random walk for the position and orientation is assumed as $$x_{n+1} = x_n + Tw_n \quad (19)$$

where $w_n \sim N(0, Q)$ can be white Gaussian noise.

The filtering task is then to estimate the state $x_n$ from the measurement $y_n$ using the model (17) and a filter. In one embodiment, $x_n$ is estimated from $y_n$ at each sample using either nonlinear least squares or inverse mapping. The state $x_n$ is then optionally filtered with a kalman filter. In another embodiment, the state $x_n$ is estimated from the measurement $y_n$ using the model (17) and a non-linear filter. In this embodiment, any non-linear filter could be applied, but a specific approach using the Extended Kalman Filter (EKF) will be discussed in further detail for the reader's convenience.

Given initial state $\hat{x}_{0|0}$, and initial error covariance $P_{0|0}$, the magnitude of the magnetic dipole moment m and the size of the tracking volume $r_0$, performance of filtering in this embodiment includes the several steps. First, a time update is performed by computing $$F_n = \nabla f(\hat{x}_{n|n}) \quad (20)$$

$$\hat{x}_{n+1|n} = f(\hat{x}_{n|n}) \quad (21)$$

$$P_{n+1|n} = F_n P_{n|n} F_n^T + Q_n \quad (22)$$

A measurement update is then performed by computing $$H_{n+1} = \nabla h(\hat{x}_{n+1|n}) \quad (23)$$

$$\hat{y}_{n+1|n} = h(\hat{x}_{n+1|n}) \quad (24)$$

$$S_{n+1|n} = H_{n+1} P_{n+1|n} H_{n+1}^T + R \quad (25)$$

$$K_{n+1} P_{n+1|n} H_{n+1}^T S_{n+1|n}^{-1} \quad (26)$$

$$\hat{x}_{n+1|n+1} = \hat{x}_{n+1|n} + K_{n+1}(y_{n+1} - \hat{y}_{n+1|n}) \quad (27)$$

$$P_{n+1|n+1} = (I - K_{n+1} H_{n+1}) P_{n+1|n} \quad (28)$$

In an optional additional step, the process ensures that the position does not diverge by projecting it onto the tracking volume, e.g., the volume shown in FIG. 1. Furthermore, the velocity may be set to zero to be consistent. Here, the tracking volume is given by the sphere centered at the origin with radius $r_0$ as follows $$\text{if } \|\hat{x}_{n+1|n+1}^{1:3}\| \geq r_0 \tag{29}$$

$$\hat{x}_{n+1|n+1}^{1:3} := \frac{r_0}{\|\hat{x}_{n+1|n+1}^{1:3}\|} \hat{x}_{n+1|n+1}^{1:3} \text{ end} \tag{30}$$

A final step, not included in the EKE, will make this specific application more robust. Furthermore, due to the non-linearity of the sensor model (2), the estimation solution has multi-modal properties. If the estimate were to end up in an erroneous mode, this could lead to divergence of the filter. To prevent such divergence, the estimate may be constrained to be within the tracking volume as noted above. This constraint can be implemented by projecting the position estimate onto the tracking volume of interest at each iteration.

As a last constraint, the estimate of the initial state $\hat{x}_{0|0}$ and the initial error covariance $P_{0|0}$ should ideally correspond to the true initial state. In an embodiment, if the state of the object when the tracking algorithm starts is not known, the initial state $\hat{x}_{0|0}$ and initial error covariance $P_{0|0}$ may be represented by a generalized default (e.g., $P_{0|0}$ large and $\hat{x}_{0|0}$ equal to some point in the tracking volume). If the size of the tracking volume is of the same order of magnitude as the extent of the vector magnetometer network, incorrect modes will be avoided and the estimated state $\hat{x}_{n|n}$ will converge to the true state $x_{n|n}$ sufficiently.

In one embodiment, the accuracy of the pose estimation is improved by calibrating the sensors, the tool and the external magnetic field. In particular, the sensor model described above may, in practice, be slightly inaccurate due to any of several reasons. Misalignments of the axis, static biases and incorrect gains in the magnetometers may cause a certain amount of inaccuracy. In addition, misalignments in the sensor deployment may be a further source of inaccuracy. In addition to these sources of error, magnetic biases due to hard (ferromagnetic) iron in the sensor platform and magnetic refractions due to soft iron in the electronics of the sensor platform may also introduce further inaccuracies.

The first order effects of such errors can be approximated by redefining the sensor model as $$\tilde{h}_j(x) = A_j h_j(x) + b_j \tag{31}$$

Each matrix $A_j \in \mathbb{R}^{3 \times 3}$ and vector $b_j \in \mathbb{R}^3$ will be unique for each sensor and its position on the electronic device and may be assumed to be constant.

As noted above, the positions of the sensors $\theta_j$ can also affect calibration. The calibration parameters are then in total 3·3+3+3=15 for each sensor, except for the first sensor if it is assumed that $\theta_1=0$. However, depending on which error sources are adjusted for, the number of calibration parameters can be reduced.

For example, if only the position and orientation of the sensors is unknown, the matrix $A_j$ may be interpreted as a rotation matrix and parameterized with the three degrees of freedom for the orientation. Together with the sensors positions $b_j$ there are then 3+3=6 unknowns for each sensor. Similarly, if only the distribution of soft and hard iron in the sensor platform is unknown, then the matrix $A_j$ may be interpreted as a positive definite matrix (in general not symmetric) representing the refraction due to the soft iron and the $b_j$ represent the bias due to the ferromagnetic content. This then presents a total 3·3+3=12 unknowns for each sensor. If instead only the axis misalignments, biases and gains in the sensors are unknown, the columns in $A_j$ will represent these misalignments and the $b_j$ represent the sensor biases. This presents 3·3+3=12 unknowns for each sensor.

These aforementioned constants may be calibrated in calibration routines by minimizing a quadratic criteria, e.g.:

$$\Theta^{sensor} = (vec(A_{1:J}), b_{1:J}, \theta_{1:J}) \tag{32}$$

$$V(x_n, \Theta^{sensor}) = (y_n - h(x_n, \Theta^{sensor}))^T R^{-1} (y_n - h(x_n, \Theta^{sensor})) \tag{33}$$

$$(\hat{x}_{1:N}, \hat{\Theta}^{sensor}) = \underset{x_{1:N}, \Theta^{sensor}}{\arg\min} \sum_{n=1}^{N} V(x_n, \Theta^{sensor}) \tag{34}$$

For example, in an embodiment, the calibration routine is to rotate the sensor platform without the presence of any magnetic objects. In another embodiment, the calibration routine is to move a calibrated tool in a predefined path, e.g., by moving the tool to certain reference points displayed on a screen of the system.

In yet another embodiment, the calibration routine is to move a calibrated tool in an arbitrary path that will excite the system sufficiently. For calibration in this embodiment, the factor of observability should be considered. Observability entails that there are at least as many measurements as there are unknown parameters.

If all 15 calibration parameters for each sensor (12 for the first sensor) are considered in conjunction with the 5 unknowns for the pose in the single dipole model (position, yaw and pitch) there are in total 5·N+12+15(J−1) unknowns, where J is the number of sensors and N is the number of samples. Furthermore, assuming that each vector magnetometer measures all three Cartesian components of the magnetic field, there are 3·J·N measurements. In order to get at least as many measurements as unknowns, in an embodiment of the invention it is required that there are at least J=2 sensors and N=27 samples.

Given a well-calibrated system, one can also calibrate the tool specific parameters. These parameters are calibrated in calibration routines as noted above by minimizing a quadratic criteria $$\Theta^{tool} = (m, m_{2:L}, s_{2:L}) \tag{35}$$

$$V(x_n, \Theta^{tool}) = (y_n - h(x_n, \Theta^{tool})) R^{-1} (y_n - h(x_n, \Theta^{tool}))^T \tag{36}$$

$$(\hat{x}_{1:N}, \hat{\Theta}^{tool}) = \underset{x_{1:N}, \Theta^{tool}}{\arg\min} \sum_{n=1}^{N} V(x_n, \Theta^{tool}) \tag{37}$$

In an embodiment, the observability requirements for this calibration problem are addressed in a similar manner as the previous calibration problem.

When calibration is to be performed for a tool consisting of multiple dipoles, the unknowns are the strength m of the first dipole and the relative positions $s_l$ and dipole alignments $m_l$ of the remaining dipoles. Furthermore, there are six unknowns for the pose of such a tool. This yields in total 6·N+1+6(L−1) unknowns, where L is the number of dipoles. With 3·J·N measurements we need at least J≥3 sensors and N≥1+2(L−1) samples in order to get at least as many measurements as unknowns.

The relatively static external magnetic field b will not always be strictly static due to variations introduced from certain sources. For example, the magnetic environment may change or the sensor platform may rotate. Similarly, the sensor platform may translate to a new location in the magnetic environment.

These sources of variation in the external magnetic field may be taken into account by assuming that the external magnetic field b is non-stationary, and augmenting it to the state vector:

$$x_n^{aug} = [x_n; b_n],\qquad(38)$$

After choosing a motion model for b, the filter described in the last section can be applied for this augmented system.

In one embodiment, the sensor platform is also equipped with a 3D gyro and a 3D accelerometer. These sensors allow the system to estimate the orientation of the platform and use that information estimate changes in the external magnetic field b due to sensor platform rotations. Furthermore, the 3D gyro and the 3D accelerometer can be used together with the magnetometers to map the magnetic environment in the vicinity of the sensor platform (using magnetic odometry or magnetic SLAM). This will further improve the calibration of the external magnetic field b due to sensor platform translatations within the magnetic environment.

In another embodiment, the external magnetic field b is assumed to be stationary and is calibrated before any moving ferromagnetic object enters the tracking volume. The external magnetic field b can then be calibrated together with the sensor biases. For each vector magnetometer, the mean of the first N samples of measurement is assigned to the total sensor bias $\bar{b}_j$ of that sensor as:

$$\bar{b}_j := \frac{1}{N}\sum_{n=1}^{N} y_{n,j}\qquad(39)$$

where $$\bar{b}_j = A_j b + b_j.$$

Figure 2:
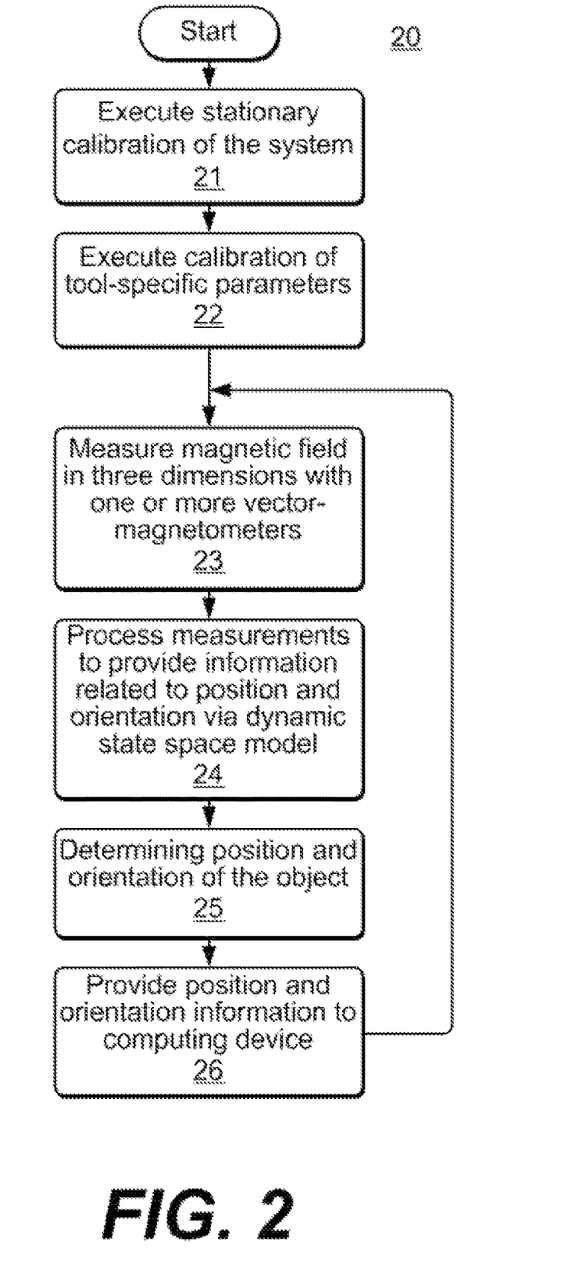
FIG. 2 is a flow chart showing a tracking process in accordance with an embodiment of the invention.

Referring again to the figures, FIG. 2 is a flowchart illustrating a process 20 for tracking an object using vector-magnetometers in accordance with an embodiment of the invention. The order of all steps is not crucial, and it will be appreciated that additional steps may be added or existing steps modified depending upon implementation details for a particular installation.

In an embodiment of the invention, the process 20 starts with two calibration steps, as illustrated at stages 21 and 22. It will be appreciated that these calibration steps are optional. The first optional calibration step at stage 21 includes performing stationary calibration of the system as described above, while the second optional calibration step at stage 22 includes the calibration of tool-specific parameters. The details of calibration of tool-specific parameters are described in greater detail above.

Figure 3:
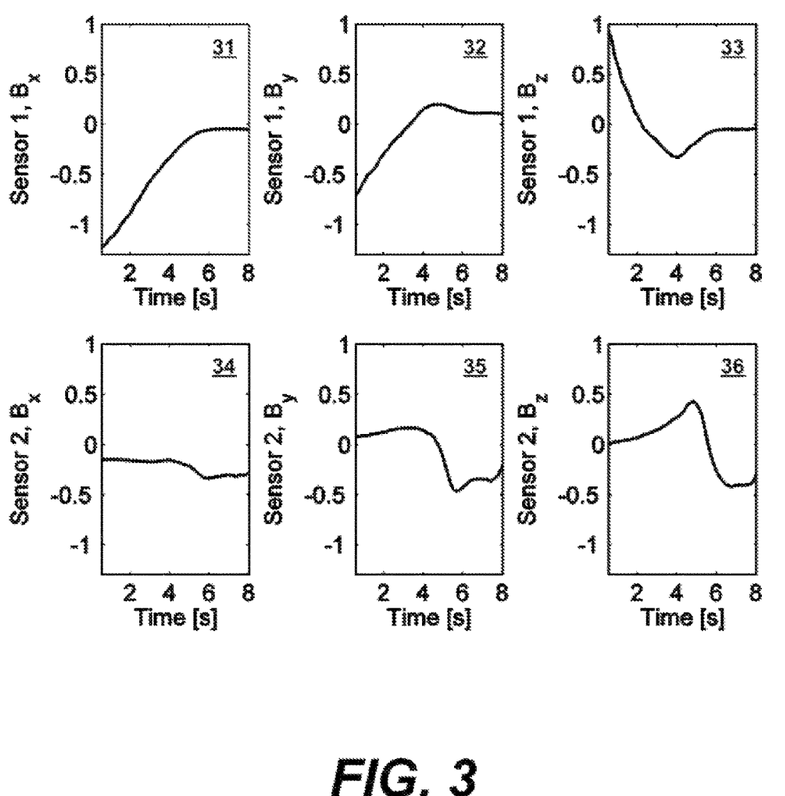
FIG. 3 is a set of magnetic field plots showing the measured magnetic field from two vector magnetometer sensors during a test run with a tracking system in a configuration according to an embodiment of the invention.

After execution of the calibration steps, if utilized, the method 20 proceeds to stage 23, which entails measuring the magnetic field with at least two vector-magnetometers (see elements 12 and 13 of FIG. 1). In keeping with this step, FIG. 3 shows measurements from two sensors during an 8-second test run. As shown, each vector-magnetometer measures the magnetic field in all three dimensions. At each time sample, a new measurement arrives. In this test run, a sampling frequency of 25 Hz was used.

Thus, the first row of plots including plots 31, 32, and 33, represents the measured magnetic fields in the x, y, and z directions respectively at sensor 1 over the course of 8 seconds. Similarly, the second row of plots including plots 34, 35, and 36, represents the measured magnetic fields in the x, y, and z directions respectively at sensor 2 over the course of the same 8 seconds.

The method 20 next entails processing the sensed magnetic field at stage 24 to relate the data to position and orientation. In an embodiment of the invention, the measurement is processed via a dynamic state space model to relate the measurements to the position and orientation of the object. In another embodiment, the processing of the sensed magnetic field can be divided into two separate substeps. The first subset includes estimating the state using the inverse mapping as discussed above. The second substep includes optionally filtering the estimate using the filtering process described above.

Figure 4:
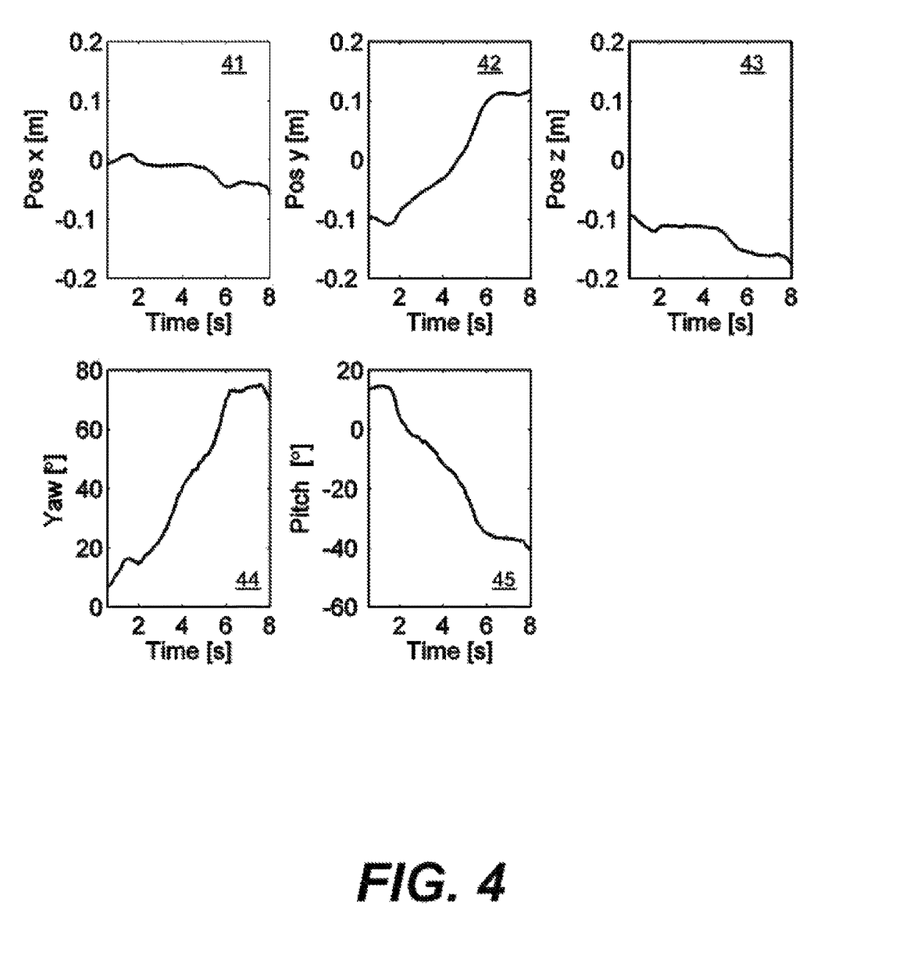
FIG. 4 is a set of position plots showing estimated position and orientation during the test run of FIG. 3, the estimates being derived via a process structured in accordance with an embodiment of the invention.

The method 20 next includes determining the position and orientation of the object at stage 25. In an embodiment, the position is identified in the corresponding part of the state vector $r_n = \hat{x}_{n|n}^{1:3}$ and the orientation is described with the yaw $\psi_n = \hat{x}_{n|n}^{4}$ and the pitch $\psi_n = \hat{x}_{n|n}^{5}$. The plots of FIG. 4 illustrates the estimated position and orientation based on the measurements reflected in FIG. 3. In particular, data plot 41 represents position in the x-direction, data plot 42 represents position in the y-direction, data plot 43 represents position in the z-direction, data plot 44 represents yaw angle of the object, and data plot 45 represents pitch angle. In addition FIG. 1 illustrates the corresponding trajectory 18 where both position and orientation (taken together, providing pose) are visualized.

Finally, the method 20 also includes sending the tracked position and orientation information to a computer program, as illustrated at stage 26, e.g., a program being directed or instructed by such information in the nature of a mouse or other input device. Stages 23-26 are repeated at each sampling instance, so that essentially real time pose information can be displayed on a screen of the computing device. In this way, the interaction between the user controlling the pose (position and orientation) of the ferromagnetic object and the computer device is efficient and natural to the user.

In an embodiment, for example, two dimensions of the position of the object can be illustrated via a pointer on a computer screen of the computing device, for providing user input to control a computer program or manipulate screen objects, e.g., by moving the pointer or cursor in two dimensions on the screen. The third position and the orientation may be used to control other functionalists of choice in that computer program, e.g., selection, "clicking," dragging, etc.

In another embodiment, the tracked position and orientation of the tracked object being manipulated by the user are used to control a virtual object on the computer screen with the same number of degrees of freedom as the physical object. For example, as the user manipulates the pose of the object in real space within the tracking volume, a virtual object in a virtual 3D space illustrated via the screen may move in the same way, mimicking the motions of the tracked object. The virtual object need not be visually the same as the tracked object, but may represent any desired item, e.g., a car, a house, a tool, etc. In an embodiment of the invention, this technique allows the user to manipulate virtual objects in a computer game 3D environment.

While only certain embodiments have been set forth, alternatives and modifications will be apparent from the above description to those skilled in the art. These and other alternatives are considered equivalents and within the spirit and scope of this disclosure and the appended claims.

What is claimed is:

1. A system for allowing a user to interact with a computer in at least 5 degrees of freedom, the system comprising:
   a computing device;
   a visual screen associated with and controlled by the computing device; two or more vector magnetometers associated with the computing device;
   a user-borne device comprising one or more permanent magnets, wherein manipulation of the user-borne device by a user is tracked by the computing device via measurement of a magnetic field associated with the one or more permanent magnets by the two or more vector magnetometers that are stationary with respect to the computing device to generate pose information associated with the user-borne device, the pose information including a position and orientation of the user-borne device, wherein each vector magnetometer detects a field associated with all of the one or more permanent magnets.

2. The system for allowing a user to interact with a computer in at least 5 degrees of freedom according to claim 1, wherein the computing device is configured to control a cursor displayed on the visual screen, based on the pose information associated with the user-borne device.

3. The system for allowing a user to interact with a computer in at least 5 degrees of freedom according to claim 1, wherein the 5 degrees of freedom include three positional degrees of freedom, a pitch degree of freedom, and a yaw degree of freedom, and wherein the computing device is configured to control a displayed object based on two of the three positional degrees of freedom.

4. The system for allowing a user to interact with a computer in at least 5 degrees of freedom according to claim 3, wherein the computing device is further configured to control a selection function based on a third of the three positional degrees of freedom.

5. The system for allowing a user to interact with a computer in at least 5 degrees of freedom according to claim 3, wherein the computing device is further configured to control a selection function based on one of the pitch degree of freedom and the yaw degree of freedom.

6. The system for allowing a user to interact with a computer in at least 5 degrees of freedom according to claim 3, wherein the computing device is further configured to filter the measurements of magnetic field associated with the one or more permanent magnets via a low pass filter.

7. The system for allowing a user to interact with a computer in at least 5 degrees of freedom according to claim 3, wherein the computing device is further configured to filter the measurements of the magnetic field associated with the one or more permanent magnets via a movement model based filter.

8. The system for allowing a user to interact with a computer in at least 5 degrees of freedom according to claim 1, wherein the user-borne device includes a set of multi-dipole tools, each having a permanent magnet associated therewith, and wherein the computing device is further configured to select one of the set of multi-dipole tools based on a best fit of a model to measurements for each of the set of multi-dipole tools.

9. The system for allowing a user to interact with a computer in at least 5 degrees of freedom according to claim 8, wherein the computing device is further configured to simultaneously track both devices.

10. The system for allowing a user to interact with a computer in at least 5 degrees of freedom according to claim 9, wherein each of the first and second user-borne devices is a multi-dipole tool to provide 6D pose information.

11. The system for allowing a user to interact with a computer in at least 5 degrees of freedom according to claim 10, wherein each of the first and second user-borne devices has a variable geometry to provide greater than 6D pose information.

12. The system for allowing a user to interact with a computer in at least 5 degrees of freedom according to claim 1, wherein the user-borne device is a multi-dipole tool to provide 6D pose information.

13. The system for allowing a user to interact with a computer in at least 5 degrees of freedom according to claim 12, wherein the user-borne device has a variable geometry for providing greater than 6D pose information.

14. The system for allowing a user to interact with a computer in at least 5 degrees of freedom according to claim 1, wherein the computing device is further configured to calibrate the sensors for sensor location, sensor orientation, and external magnetic influences.

15. The system for allowing a user to interact with a computer in at least 5 degrees of freedom according to claim 1, wherein the computing device is further configured to calibrate for tool-specific parameters of the user-borne device.

16. The system for allowing a user to interact with a computer in at least 5 degrees of freedom according to claim 1, wherein the computing device is further configured to calibrate for a dynamic external magnetic field.

17. The system for allowing a user to interact with a computer in at least 5 degrees of freedom according to claim 1, wherein the computing device is further configured to filter the pose information based on physical motion constraints associated with the user-borne device.

18. The system for allowing a user to interact with a computer in at least 5 degrees of freedom according to claim 1, wherein the computing device is further configured to filter the pose information via a low pass filter.

19. The system for allowing a user to interact with a computer in at least 5 degrees of freedom according to claim 1, wherein the computing device is further configured to filter the pose information via a model based filter.

20. The system for allowing a user to interact with a computer in at least 5 degrees of freedom according to claim 1, wherein the computing device is further configured to filter the pose information via one of a kalman filter and a non-linear filter.

* * * * *